United States Patent
Zhou et al.

(10) Patent No.: US 12,406,109 B1
(45) Date of Patent: Sep. 2, 2025

(54) STEADY-STATE SITE DRIVING CONDITION DEVELOPMENT METHOD BASED ON TRANSIENT-STATE DRIVING CONDITION

(71) Applicants: CHINA AUTOMOTIVE TECHNOLOGY AND RESEARCH CENTER CO., LTD, Tianjin (CN); CATARC AUTOMOTIVE TEST CENTER (TIANJIN) CO., LTD, Tianjin (CN)

(72) Inventors: Hua Zhou, Tianjin (CN); Yu Liu, Tianjin (CN); Kunqi Ma, Tianjin (CN); Jingyuan Li, Tianjin (CN); Zhengjun Yang, Tianjin (CN); Hanzhengnan Yu, Tianjin (CN); Xiaopan An, Tianjin (CN); Yongkai Liang, Tianjin (CN); Xi Hu, Tianjin (CN); Hao Zhang, Tianjin (CN); Shimin Zhang, Tianjin (CN)

(73) Assignees: CHINA AUTOMOTIVE TECHNOLOGY AND RESEARCH CENTER CO., LTD, Tianjin (CN); CATARC AUTOMOTIVE TEST CENTER (TIANJIN) CO., LTD, Tianjin (CN)

( * ) Notice: Subject to any disclaimer, the term of this patent is extended or adjusted under 35 U.S.C. 154(b) by 0 days.

(21) Appl. No.: 18/913,229

(22) Filed: Oct. 11, 2024

(30) Foreign Application Priority Data

Apr. 9, 2024 (CN) .......................... 202410418490.0

(51) Int. Cl.
*G06F 30/15* (2020.01)
*G07C 5/02* (2006.01)

(52) U.S. Cl.
CPC ............... *G06F 30/15* (2020.01); *G07C 5/02* (2013.01)

(58) Field of Classification Search
CPC .......... G06F 30/15; G06F 30/10; G06F 30/00; G07C 5/02; G07C 5/00
See application file for complete search history.

(56) References Cited

U.S. PATENT DOCUMENTS

| 7,962,256 B2* | 6/2011 | Stevens ................ G05D 1/0891 |
| | | 180/65.245 |
| 2017/0050590 A1* | 2/2017 | List ......................... B60L 58/12 |
| 2024/0166208 A1* | 5/2024 | Shi ....................... B60W 30/143 |

FOREIGN PATENT DOCUMENTS

| CN | 107845261 A | 3/2018 |
| CN | 108596208 A | 9/2018 |

(Continued)

OTHER PUBLICATIONS

Hanrui Peng et al. "A Construction Method Suitable for Driving Cycles of Urban Mixed Roads", China Academic Journal Electronic Publishing House, Dec. 31, 2019.

*Primary Examiner* — Mohamed Charioui

(57) ABSTRACT

The present disclosure discloses a steady-state site driving condition development method based on a transient-state driving condition, including: fragmenting a laboratory chassis drum transient-state speed-time curve to obtain transient-state motion segments; fragmenting the transient-state motion segment that is not pretreated with reference to a minimum speed of the pretreated transient-state motion segments to obtain transient-state sub-motion segments; merging the transient-state sub-motion segments, calculating maximum constant speeds and mean accelerations and mean decelerations of steady-state motion segments; converting acceleration and deceleration processes into uniform acceleration and uniform deceleration processes, calculating acceleration and deceleration durations of the steady-state motion segments to obtain steady-state motion segment; connecting steady-state motion segments according to time (Continued)

axes, inserting idle segments between the steady-state motion segments and at the beginning and end of a steady-state driving condition, so as to obtain a steady-state site test driving condition.

9 Claims, 6 Drawing Sheets

(56) References Cited

FOREIGN PATENT DOCUMENTS

| | | | |
|---|---|---|---|
| CN | 115031988 | A | 9/2022 |
| CN | 115587276 | A | 1/2023 |
| CN | 115964905 | A | 4/2023 |
| CN | 117400948 | A | 1/2024 |
| SU | 1484492 | A1 | 6/1989 |

* cited by examiner

STEADY-STATE SITE DRIVING CONDITION DEVELOPMENT METHOD BASED ON TRANSIENT-STATE DRIVING CONDITION

CROSS-REFERENCE TO RELATED APPLICATION

This application claims priority from the Chinese patent application 2024104184900 filed Apr. 9, 2024, the content of which is incorporated herein in the entirety by reference.

TECHNICAL FIELD

The present disclosure relates to the technical field of vehicle tests, in particular to a steady-state site driving condition development method based on a transient-state driving condition.

BACKGROUND ART

With the improvement of the number of new energy vehicles in use, the problem of range of the new energy vehicles (NEVs) on real roads in extreme (extremely cold/extremely hot) environments gradually becomes a hot spot of attention of consumers and a pain point of research and development of manufacturers.

At present, the conventional research method is that the range tests of the NEVs are carried out in laboratory environmental cabins in the simulated extremely cold/hot environments, but the method cannot truly reflect complex and changeable driving environments, such as road surfaces and climates, encountered by users in actual driving environments. As a result, there is a discrepancy between the range test results of the laboratory and the actual driving results of the users, leading to user complaints. There are natural critical test sites in Turpan, Yakeshi and Mohe in China. However, the range tests of the NEVs in the current national standards are based on laboratory chassis drum transient-state driving conditions, and drivers cannot reproduce on the test sites. As a result, during the range tests on the test sites, enterprises mostly carry out tests in the manner of vehicle following or constant-speed running. Due to the lack of standardized driving conditions, the varying driving habits of different drivers will lead to inconsistencies in speed and acceleration among different vehicles during driving, resulting in the non-comparable and unconvincing range test results of the vehicles.

Therefore, it is necessary to develop steady-state driving conditions which are consistent with the motion characteristics of the laboratory transient-state driving conditions and can be reproduced on real roads by the drivers according to the laboratory transient-state driving conditions, and provide a unified test driving condition for the enterprises to carry out the vehicle range tests on the test sites.

SUMMARY OF THE DISCLOSURE

The present disclosure aims to solve the problem of difficulty in reproducing a laboratory transient driving condition by a driver on test sites, and provides a steady-state site driving condition development method based on a transient driving condition.

The present disclosure is implemented as follows:

A steady-state site driving condition development method based on a transient-state driving condition includes the following steps:

S1. fragmenting a chassis drum transient-state driving condition expressed as a laboratory chassis drum transient-state speed-time curve by a short-range method to obtain transient-state motion segments;

S2. pretreating the transient-state motion segment obtained by fragmentation to obtain a minimum speed of the pretreated transient-state motion segments, and fragmenting the transient-state motion segment that is not pretreated with reference to coordinates corresponding to the minimum speed to obtain a plurality of transient-state sub-motion segments;

S3. merging the transient-state sub-motion segments meeting merging requirements according to maximum speeds and durations of the transient-state sub-motion segments, and recording maximum speeds and durations of merged transient-state motion segments formed by combining the non-merged transient-state sub-motion segments and the merged transient-state sub-motion segments;

S4. calculating maximum constant speeds under a steady-state driving condition based on the maximum speeds of the transient-state sub-motion segments, and calculating mean accelerations and mean decelerations of steady-state motion segments;

S5. converting acceleration and deceleration processes of the transient-state sub-motion segments into uniform acceleration and uniform deceleration processes according to the maximum constant speeds, calculating acceleration durations and deceleration durations of the steady-state motion segments, calculating constant speed durations according to a total duration of the steady-state motion segments, and finally obtaining the steady-state motion segment corresponding to each transient-state sub-motion segment; and S6. sequentially connecting a plurality of steady-state motion segments according to time axes, inserting idle segments with fixed durations between the steady-state motion segments and at the beginning and end of a steady-state driving condition, and finally obtaining a steady-state site test driving condition based on the chassis drum transient-state driving condition.

Wherein in step S2, the pretreatment is to smooth the transient-state motion segment obtained by fragmentation with the short-range method by a moving average window method.

Wherein in step S2, one transient-state sub-motion segment is defined as a transient-state motion segment between time axes corresponding to two adjacent minimum speed of the transient-state motion segment that is not pretreated.

Wherein in step S2, the step of fragmenting the transient-state motion segment that is not pretreated with reference to the coordinates corresponding to the minimum speed of the pretreated transient-state motion segments involves fragmenting the transient-state motion segment that is not pretreated based on time coordinates corresponding to the minimum speed of the pretreated transient-state motion segments.

Wherein in step S3, the step of merging the transient-state sub-motion segments meeting the merging requirements includes:

judging whether a maximum speed difference between the adjacent transient-state sub-motion segments is smaller than a speed threshold and whether the duration of the single transient-state sub-motion segment is smaller than a duration threshold; if yes, merging the adjacent transient-state sub-motion segments until a maximum speed difference between a combination of the merged transient-state motion segments and the next transient-state sub-motion segment is greater than or equal to a speed threshold and the duration of the combination of the merged transient-state motion segments is greater than or equal to a duration threshold.

Wherein in step S3, the merged transient-state motion segment includes a single-segment motion segment only including one sub-motion segment and a multi-segment motion segment including a combination of at least two sub-motion segments.

Wherein in step S4, the maximum constant speed under the steady-state driving condition is calculated with following formula:

$V_{constant\ speed} = V_{max} \times 0.8$, where $V_{max}$ is the maximum speed of the transient-state sub-motion segment, and $V_{constant\ speed}$ is the maximum constant speed under the steady-state driving condition; and the mean acceleration and the mean deceleration of each of the steady-state motion segments are calculated with following formula:

$$meanacc_{acceleration} = \frac{\sum a^+}{t_{a^+}}, meanacc_{deceleration} = \frac{\sum a^-}{t_{a^-}}, a_i = \frac{v_{i+1} - v_{i-1}}{7.2},$$

where $a_i$ is an acceleration of the merged transient-state motion segment at the $i^{th}$ second, $v_{i+1}$ and $v_{i-1}$ are speeds of the merged transient-state motion segment at the $i+1^{th}$, $i-1^{th}$ second (unit: km/h), and $meanacc_{acceleration}$ is the mean acceleration of the steady-state motion segment (unit: m/s$^2$); $a^+$ is an acceleration value of the merged transient-state motion segment during acceleration (unit: m/s$^2$); $t_{a^+}$ is cumulative time of the merged transient-state motion segment during acceleration (unit: s); $meanacc_{deceleration}$ is the mean deceleration of the steady-state motion segment (unit: m/s$^2$); $a^-$ is a deceleration value of the merged transient-state motion segment during deceleration (unit: m/s$^2$); and $t_{a^-}$ is cumulative time of the merged transient-state motion segment during deceleration (unit: s).

Wherein in step S5, the calculating the acceleration durations and the deceleration durations of the steady-state motion segments, and calculating the constant speed durations according to the total duration of the merged transient-state motion segments is performed by following formulae:

$L_{acceleration} = (V_{constant\ speed}/meanacc_{acceleration})/3.6$, $L_{deceleration} = (V_{constant\ speed}/meanacc_{deceleration})/3.6$, and $L_{constant\ speed} = L_{motion\ segment} - L_{acceleration} - L_{deceleration}$, where $L_{motion\ segment}$ is the total duration of the merged steady-state motion segments, $L_{acceleration}$ is the acceleration duration of the steady-state motion segment (unit: s), $L_{deceleration}$ is the deceleration duration of the steady-state motion segment (unit: s), and $L_{constant\ speed}$ is the constant speed duration of the steady-state motion segment (unit: s); in the case of the steady-state motion segment serving as the multi-segment motion segment, the constant speed duration of the steady-state sub-motion segment of the steady-state motion segment is calculated with following formula:

$L_{constant\ speed\ i} = L_{sub-motion\ segment\ i}/L_{steady-state\ motion\ segment} \times L_{constant\ speed}$, where $L_{constant\ speed\ i}$ is the constant speed duration of the $i^{th}$ steady-state sub-motion segment in the steady-state motion segment of the multi-segment motion segment, $L_{sub-motion\ segment\ i}$ is the duration of the $i^{th}$ steady-state sub-motion segment in the steady-state motion segment of the multi-segment motion segment, and $L_{steady-state\ motion\ segment}$ is the total duration of the steady-state motion segments.

Wherein in step S6, the duration of the idle segment is calculated with following formula:

$L_{idle} = (L_{driving\ condition} - L)/(\text{number of steady-state motion segments} + 1)$;

where $L_{idle}$ is the duration of the to-be-inserted idle segment, $L_{driving\ condition}$ is a total duration of the transient-state driving condition including idle, and L is the total duration of the steady-state motion segments.

Wherein the method further includes the following steps after step S6:

calculating and comparing a deviation between preset indexes for the chassis drum transient-state condition and the steady-state site test condition, and determining whether the obtained steady-state site test condition accords with the driving characteristics of the chassis drum transient-state condition based on the deviation;

the preset index includes a mean acceleration, a mean deceleration, a mean speed, a mean driving speed and an idle proportion; and the mean speed is a mean of all speed points, the mean driving speed is a mean of all speed points excluding where the speed is 0, and the idle proportion is the proportion of the moment at which the speed is 0 to the total duration of the driving condition.

According to the steady-state site driving condition development method based on the transient-state driving condition, the steady-state site test driving condition which is configured for site tests is finally developed through the laboratory chassis drum transient-state speed-time curve, namely the transient-state driving condition, so that the problem of difficulty in reproducing the laboratory chassis drum transient-state driving condition by the driver to test vehicles on the test site in the prior art is solved.

DETAILED DESCRIPTION OF THE PRESENT DISCLOSURE

The present disclosure will be further stated in details with reference to accompanying drawings and specific embodiments below. It should be understood that the specific embodiments described herein are only for explaining the present disclosure, but are not construed as limitations to the present disclosure.

According to the embodiment of the present disclosure, a steady-state site driving condition development method based on a transient-state driving condition is developed on the basis of a laboratory chassis drum transient-state driving condition, so as to provide a unified test driving condition for site tests of vehicles, thus helping enterprises to make an objective evaluation on the energy consumption of the vehicles on the test site.

According to the embodiment of the present disclosure, the steady-state site test driving condition which is configured for site tests is finally developed through a laboratory chassis drum transient-state speed-time curve, namely a transient-state driving condition, so that the problem of difficulty in reproducing the laboratory chassis drum transient-state driving condition by a driver on the test site to test vehicles on the test site in the prior art is solved.

Figure 1:
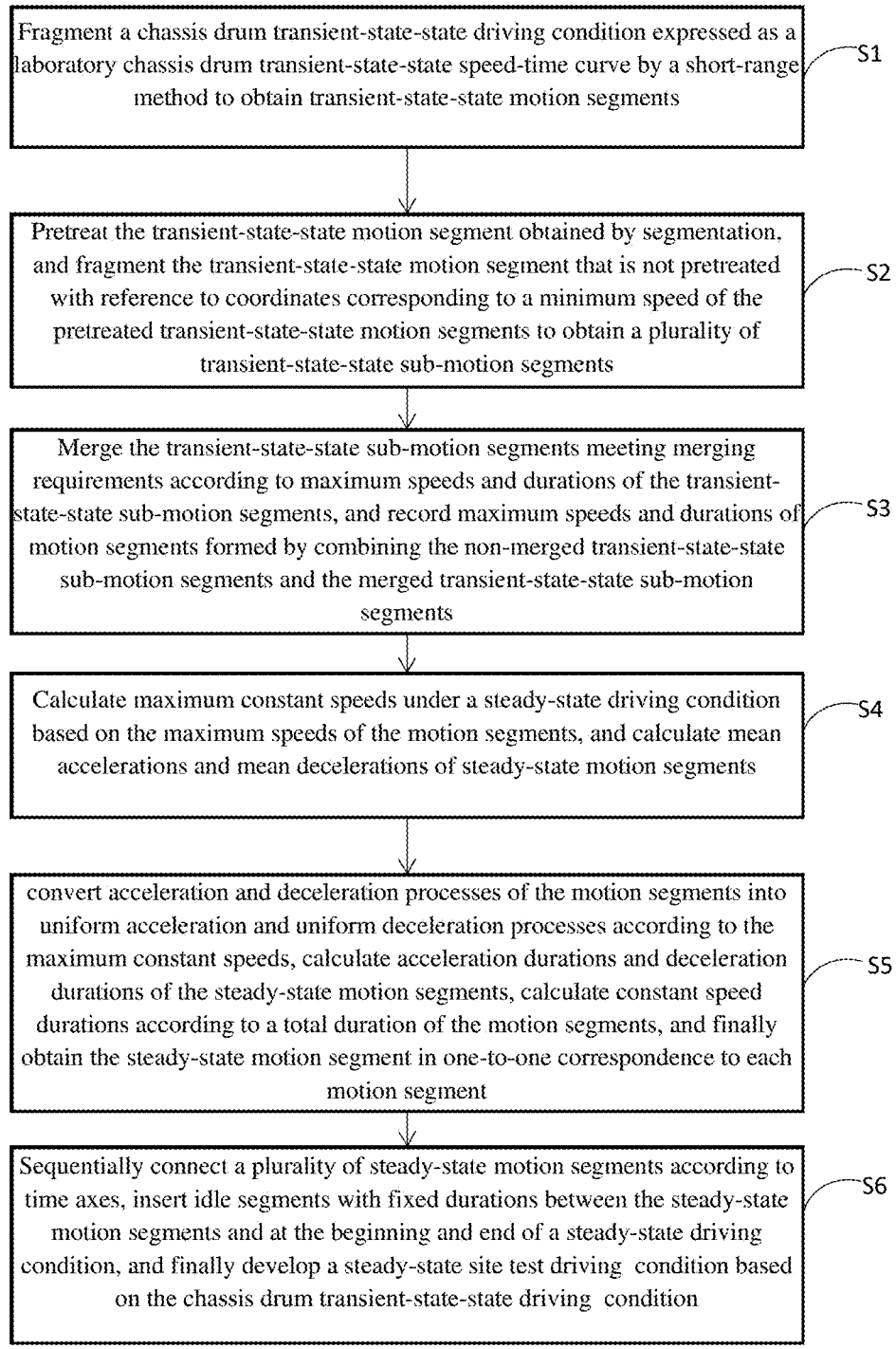
FIG. 1 is a flowchart illustrating a steady-state site driving condition development method based on a transient-state driving condition according to an embodiment of the present disclosure.

As shown in FIG. 1, the embodiment of the present disclosure is based on the laboratory chassis drum transient-state driving condition, and includes the following steps:

S1. a laboratory chassis drum transient-state driving condition is fragmented by a short-range method to obtain transient-state motion segments;

S2. the transient-state motion segment obtained by fragmentation is pretreated to obtain a minimum speed of the pretreated transient-state motion segments, and the transient-state motion segment that is not pretreated is further fragmented with reference to coordinates corresponding to the minimum speed to obtain a plurality of transient-state sub-motion segments;

S3. the transient-state sub-motion segments meeting merging requirements are merged according to maximum speeds and durations of the transient-state sub-motion segments, and maximum speeds and durations of motion segments formed by combining the non-merged transient-state sub-motion segments and the merged transient-state sub-motion segments are recorded;

S4. maximum constant speeds under a steady-state driving condition are calculated based on the maximum speeds of the transient-state sub-motion segments, and mean accelerations and mean decelerations of steady-state motion segments are calculated;

S5. acceleration and deceleration processes of the transient-state motion segments are converted into uniform acceleration and uniform deceleration processes according to the maximum constant speeds, acceleration durations and deceleration durations of the steady-state motion segments are calculated, constant speed durations are calculated according to a total duration of the steady-state motion segments, and finally the steady-state motion segment in one-to-one correspondence to each transient-state sub-motion segment is obtained; and S6. a plurality of steady-state motion segments are sequentially connected according to time axes, idle segments with fixed durations are inserted between the steady-state motion segments and at the beginning and end of a steady-state driving condition, and finally a steady-state site test driving condition is developed based on the chassis drum transient-state driving condition.

According to the steady-state site driving condition development method based on the transient-state driving condition of the present disclosure, the steady-state site test driving condition which is configured for site tests is finally developed through a laboratory chassis drum transient-state speed-time curve, namely a transient-state driving condition, and then vehicles may be subjected to the site tests by utilizing the steady-state site test driving condition, so that the problem of difficulty in reproducing the laboratory chassis drum transient-state driving condition by the driver on the test site to test vehicles on the test site in the prior art is solved through the development of the steady-state site test driving condition, thus solving the technical problem claimed in the background.

In step S2 of the present application, the laboratory chassis drum transient-state driving condition is fragmented by the short-range method, the short range represents a driving state (a process from speed 0 to speed 0) or a segment of the vehicle between two adjacent stopping points, and consists of an idle section and a transient-state motion segment adjacent to the idle section, so that a plurality of required transient-state motion segments may be obtained after fragmenting for pretreatment.

Wherein in step S2 of the present application, the pretreatment is to smooth the transient-state motion segment obtained by fragmentation with the short-range method by a moving average window method.

Wherein when the transient-state motion segment that is not pretreated with reference to the coordinates corresponding to the minimum speed of the pretreated transient-state motion segments is further fragmented, the transient-state motion segment that is not pretreated is fragmented based on time coordinates corresponding to the minimum speed of the pretreated transient-state motion segments.

Wherein one transient-state sub-motion segment is defined as a motion segment between two adjacent minimum speed of the transient-state motion segment that is not pretreated.

Further, in the present disclosure, before step S2, in order to avoid excessively fragmenting the transient-state sub-motion segments, the transient-state driving condition performs smoothing before fragmenting, such as eliminating local minimum speed therein, and then the transient-state driving condition is fragmented based on time coordinates corresponding to the minimum speed under the smoothed transient-state driving condition, so as to obtain a plurality of transient-state sub-motion segments.

Wherein each transient-state sub-motion segment includes an acceleration process, a constant speed process and a deceleration process.

Preferably, in the present application, when the smoothing is performed, a preset window width threshold is adopted, for example, the window width threshold is 5; and the window width threshold may be selected or adjusted according to requirements, namely, the transient-state motion state of the laboratory transient-state driving condition obtained by fragmentation with the short-range method is smoothed by the moving average window method to obtain the transient-state motion segment of the pretreated laboratory transient-state driving condition.

In order to reduce the operation difficulty of the driver on the test site, a merging rule of the corresponding transient-state sub-motion segments is preset, and then the fragmented adjacent transient-state sub-motion segments are merged according to the preset merging rule of the transient-state sub-motion segments.

Specifically, the method for merging the transient-state sub-motion segments is as follows: it is required to judge at least one of the following: whether a maximum speed difference between the adjacent transient-state sub-motion segments is smaller than a speed threshold or whether the duration of the single transient-state sub-motion segment is smaller than a duration threshold; if yes, the adjacent transient-state sub-motion segments are merged until a maximum speed difference between a combination of the merged transient-state motion segments and the next transient-state sub-motion segment is greater than or equal to a speed threshold and the duration of the combination of the merged transient-state motion segments is greater than or equal to a duration threshold; and preferably, in the case where the maximum speed difference between the adjacent transient-state sub-motion segments is smaller than 5 km/h, the duration of the transient-state sub-motion segment is smaller than 45 s.

In the present disclosure, in step S3, the merged transient-state motion segment formed by merging the transient-state sub-motion segments includes a single-segment motion segment only including the single sub-motion segment and a multi-segment motion segment including a combination of at least two sub-motion segments.

Wherein in step S4, the maximum constant speed under the steady-state driving condition is calculated with following formula:

$$V_{constant\ speed} = V_{max} \times 0.8 \qquad (1),$$

Where $V_{max}$ is the maximum speed of the transient-state sub-motion segment formed by merging, and $V_{constant\ speed}$ is the maximum constant speed under the steady-state driving condition; and the mean acceleration or the mean deceleration of the steady-state motion segment is calculated with the following formulae:

$$a_i = \frac{v_{i+1} - v_{i-1}}{7.2}, \qquad (2)$$

$$meanacc_{acceleration} = \frac{\sum a^+}{t_{a^+}}, \qquad (3)$$

$$meanacc_{deceleration} = \frac{\sum a^-}{t_{a^-}}, \qquad (4)$$

Where $a_i$ is an acceleration of the merged transient-state motion segment formed by merging the transient-state sub-motion segments at the $i^{th}$ second, and $v_{i+1}$ and $v_{i-1}$ are speeds of the merged transient-state motion segment formed by merging the transient-state sub-motion segments at the $(i+1)^{th}$ and $(i-1)^{th}$ second, and $meanacc_{acceleration}$ is the mean acceleration of steady-state motion segments; $a^+$ is an acceleration value of the merged transient-state motion segment formed by merging the transient-state sub-motion segments during acceleration; $t_{a^+}$ is cumulative time of the merged transient-state motion segment formed by merging the transient-state sub-motion segments during acceleration; $meanacc_{deceleration}$ is the mean deceleration of each of the steady-state motion segments; $a^-$ is a deceleration value of the merged transient-state motion segment formed by merging the transient-state sub-motion segments during deceleration; and $t_{a^-}$ is cumulative time of the merged transient-state motion segment formed by merging the transient-state sub-motion segments during deceleration.

Wherein in step S5, the acceleration durations and the deceleration durations of the steady-state motion segments are calculated, and the constant speed durations are calculated according to the total duration of the motion segments by the following formulae:

$$L_{acceleration} = (V_{constant\ speed}/meanacc_{acceleration})/3.6 \qquad (5),$$

$$L_{deceleration} = (V_{constant\ speed}/meanac_{deceleration})/3.6 \qquad (6),$$

$$L_{constant\ speed} = L_{motion\ segment} - L_{acceleration} - L_{deceleration} \qquad (7),$$

where $L_{motion\ segment}$ is the total duration of the merged transient-state motion segments, $L_{acceleration}$ is the acceleration duration of the steady-state motion segment, $L_{deceleration}$ is the deceleration duration of the steady-state motion segment, and $L_{constant\ speed}$ is the constant speed duration of the steady-state motion segment; in the case of the steady-state motion segment serving as the multi-segment motion segment, the constant speed duration of the steady-state sub-motion segment of the steady-state motion segment is calculated with the following formula:

$$L_{constant\ speed\ i} = L_{sub-motion\ segment\ i}/L_{steady-state\ motion\ segment} \times L_{constant\ speed} \qquad (8),$$

where $L_{constant\ speed\ i}$ is the constant speed duration of the $i^{th}$ steady-state sub-motion segment in the steady-state motion segment of the multi-segment motion segment, $L_{sub-motion\ segment\ i}$ is the duration of the $i^{th}$ steady-state sub-motion segment in the steady-state motion segment of the multi-segment motion segment, and $L_{steady-state\ motion\ segment}$ is the total duration of the steady-state motion segments.

Wherein in step S6, the duration of the idle segment is calculated with the following formula:

$$L_{idle} = (L_{driving\ condition} - L)/(\text{number of steady-state motion segments} + 1) \qquad (9),$$

where $L_{idle}$ is the duration of the to-be-inserted idle segment, $L_{driving\ condition}$ is a total duration of the transient-state driving condition including idle, and L is the total duration of the steady-state motion segments.

Wherein the method further includes the following steps after step S6:

a deviation between preset indexes for the chassis drum transient-state driving condition and the steady-state site test driving condition is calculated and compared, and it is determined whether the developed steady-state site test driving condition accords with the driving characteristics of the chassis drum transient-state driving condition based on the deviation, for example, a preset threshold of the deviation may be designed, e.g., 3%, or another proportional value.

The preset index includes a mean acceleration, a mean deceleration, a mean speed, a mean driving speed and an idle proportion; and the mean speed is a mean of all speed points, the mean driving speed is a mean of all speed points excluding where the speed is 0, and the idle proportion is the proportion of the moment at which the speed is 0 to the total duration of the driving condition.

After the steady-state site test driving condition is developed through the above-mentioned steps, the vehicle driving range test may be carried out on the test site by utilizing the steady-state site test driving condition (steady-state curve).

Before testing the vehicle to obtain the steady-state site test driving condition, the vehicle to be tested needs to be pretreated to reach the state required by the test, followed by carrying out the test.

The present application provides an embodiment of pretreatment, for example, the pretreatment includes the following steps: firstly vehicle tires are replaced with snow tires or high-temperature-resistant tires, and tire pressure is adjusted according to a related method (such as a method in the National Standard GB18352.6-2016 Annex C); and after the adjustment is finished, high-speed discharge is carried out at a normal temperature (such as 23° C.+/−3° C.) and a constant speed of 120 km/h in a laboratory environment cabin and then stops until the remaining battery power displayed on a vehicle's dashboard is 0. Secondly, the vehicle is charged in the environmental cabin until a charging pile or the vehicle's dashboard indicates that the charging is completed, wherein the temperature of the environmental cabin is set to be the average temperature of a local garage during charging; and then, the fully charged vehicle is placed in a vehicle dipping room for vehicle dipping, wherein the vehicle dipping temperature is consistent with the average temperature of the local garage, and the vehicle dipping time is not less than 8 hours.

After the above-mentioned vehicle pretreatment is finished, the driving range test may be carried out on the test site.

Before the test begins, a V-BOX smart vehicle-mounted terminal is installed on the vehicle to be tested, which is configured to collect the driving speed of the vehicle; a setting of an air conditioner of the vehicle is consistent with the range test method at high and low temperatures in GB/T18386.1-2021 during the driving process; and if the estimated test duration exceeds 6 hours, the driver operates the vehicle by turns every 6 hours until the vehicle's dashboard displays the remaining battery power as 0, the test is ended.

Wherein the range result S (unit: km) is calculated with following formula:

$$S = \sum_{i=1}^{end} v_i/3600, \quad (10)$$

where $v_i$ is the speed of the vehicle at the $i^{th}$ second after the beginning of the test, unit (km/h).

If the cumulative time proportion of the speed of the vehicle to be tested exceeding a tolerance zone of a steady-state driving condition speed curve exceeds 1% during the test process, the test result is considered invalid.

Wherein an upper tolerance limit is $v_{imax} = v_{idriving\ condition} + 2$, a lower tolerance limit is $v_{imin} = v_{idriving\ condition} - 2$, and $v_{idriving\ condition}$ is the speed of the vehicle at the $i^{th}$ second under the steady-state driving condition, unit (km/h).

The development steps of the steady-state site test driving condition are described by taking a section of the laboratory chassis drum transient-state driving condition as an example.

Figure 2:
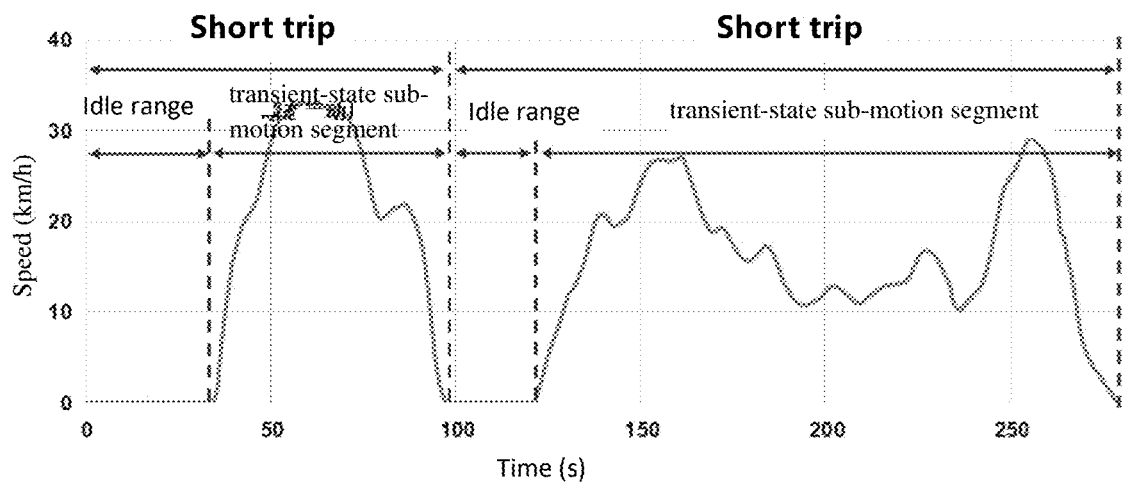
FIG. 2 is a schematic diagram illustrating fragmenting using a short-range method.

A laboratory chassis drum transient-state driving condition is fragmented by a short-range method firstly. The short-range division method is shown in FIG. 2, and if two short ranges are configured to fragment the transient-state driving condition, and the idle segments are separated from the transient-state driving condition to obtain corresponding transient-state motion segments. The technology belongs to the prior art, and the division method is not described in detail.

Figure 3:
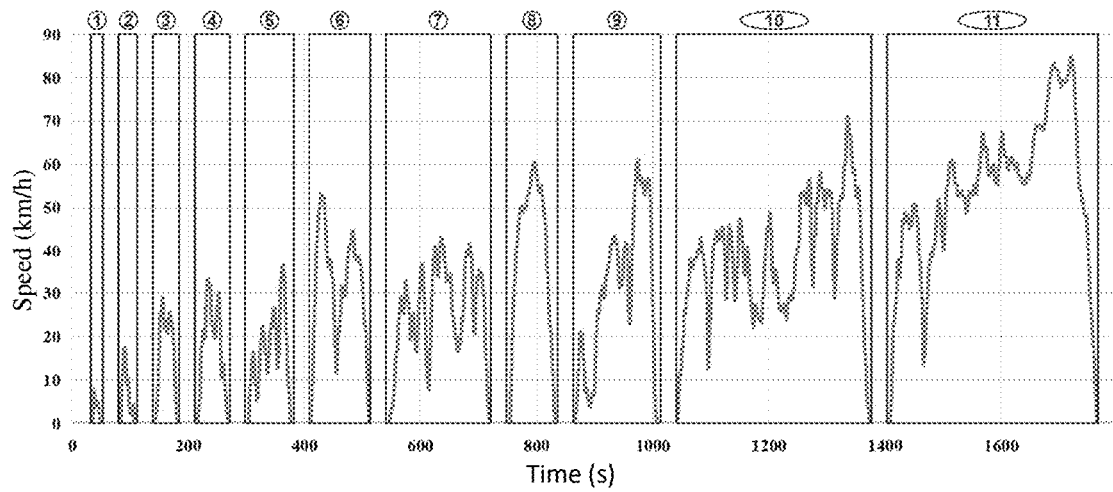
FIG. 3 is a schematic diagram illustrating fragmenting of a transient-state driving condition using a short-range method.

The laboratory transient-state driving condition is fragmented into 11 transient-state motion segments by a short-range division method, as shown in FIG. 3.

Figure 4:
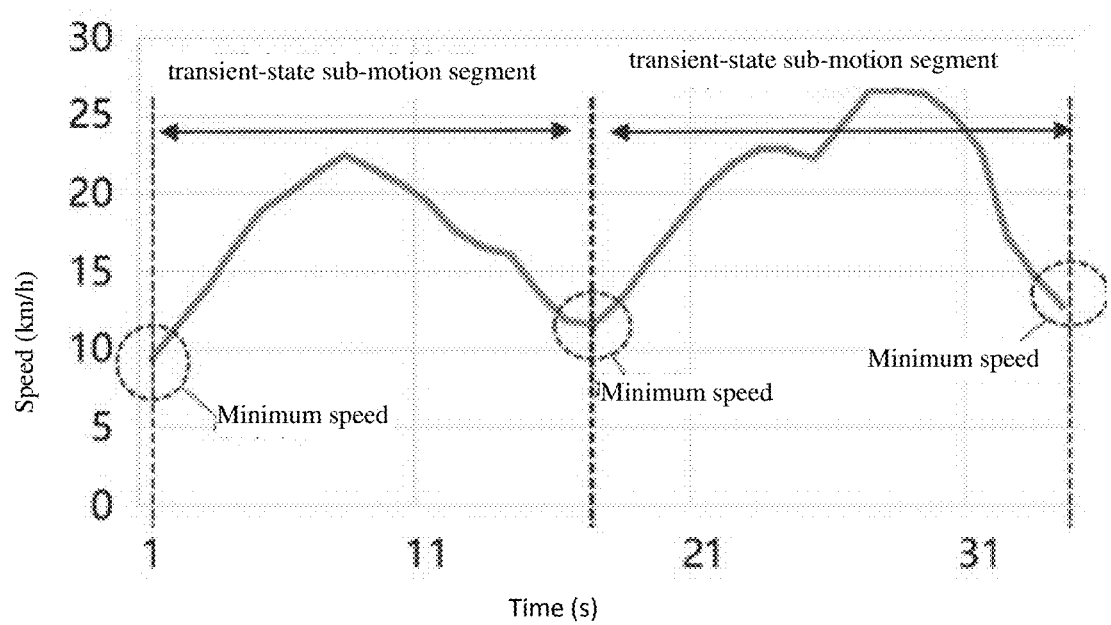
FIG. 4 is a schematic diagram illustrating a method for fragmenting a pretreated transient-state motion segment under a transient-state driving condition based on a minimum speed to form a transient-state sub-motion segment.

The 11 transient-state motion segments as shown in FIG. 3 are further fragmented, and a segment between points corresponding to every two minima (such as three minima in FIG. 4) in the transient-state motion segments is denoted as 1 transient-state sub-motion segment, as shown in FIG. 4, and the transient-state motion segment is fragmented to obtain two transient-state sub-motion segments.

Figure 5:
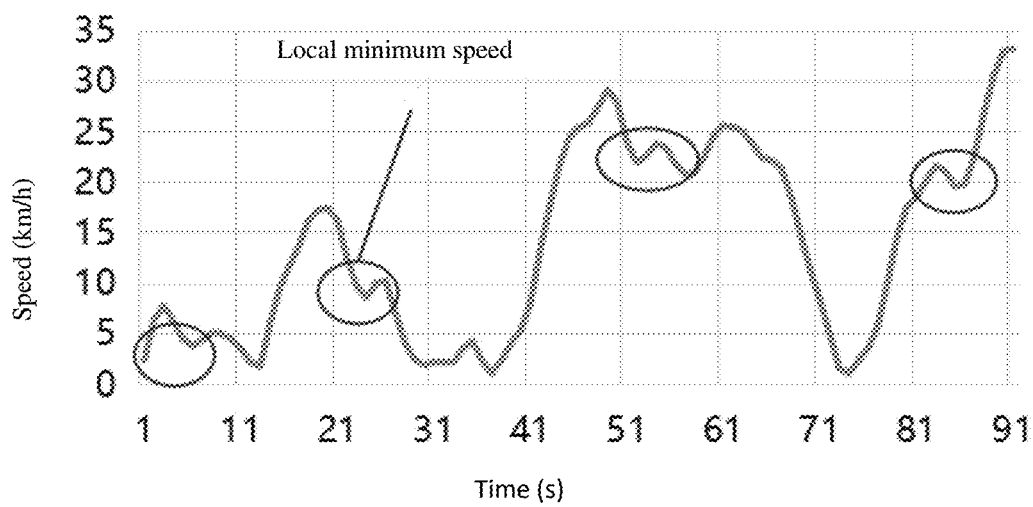
FIG. 5 is a schematic diagram illustrating smoothing of a transient-state motion segment under a transient-state driving condition.
Figure 6:
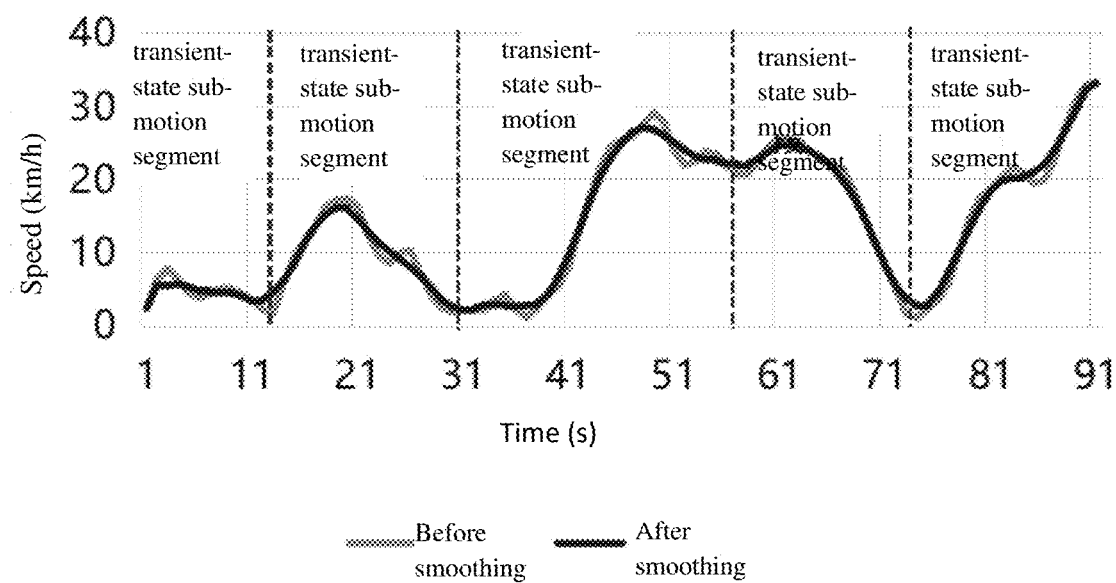
FIG. 6 is a comparison diagram illustrating curves before and after smoothing of a transient-state motion segment under a transient-state driving condition.

It should be noted that in the present application, considering that speed fluctuates during the actual driving process, local minima occur, as shown in FIG. 5, in order to avoid the excessive fragmentation of the transient-state motion segment, the influence of these local minima needs to be eliminated. Therefore, before being fragmented, the transient-state motion segment needs to be smoothed (for example, a moving average window method is used, with a window width of 5), and effects before and after the transient-state motion segment is smoothed are shown in FIG. 6.

Figure 7:
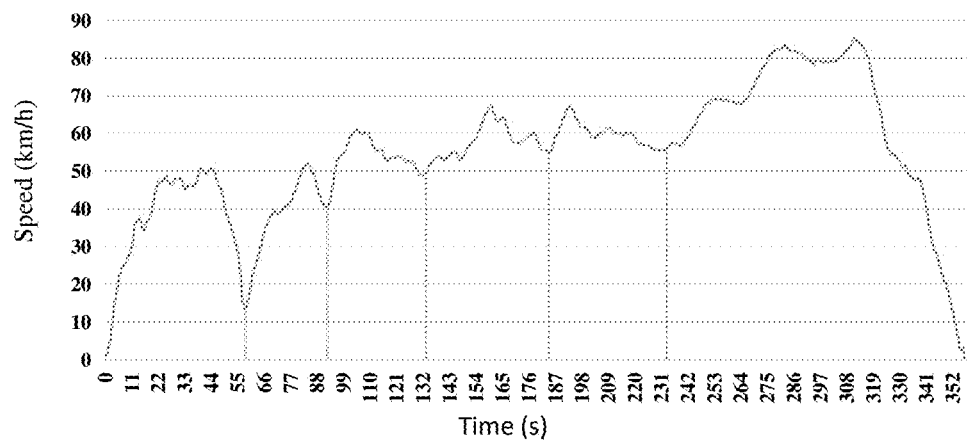
FIG. 7 is a schematic diagram illustrating a plurality of transient-state sub-motion segments obtained by fragmenting a transient-state motion segment under a transient-state driving condition based on a minimum speed under the transient-state driving condition.

After the transient-state motion segment is smoothed, the transient-state motion segment that is not smoothed is fragmented based on an abscissa value corresponding to the minimum speed of the smoothed transient-state motion segment. Taking the 11th transient-state motion segment in FIG. 3 as an example, the transient-state motion segment is fragmented into 6 transient-state sub-motion segments, as shown in FIG. 7.

Finally, according to the method, the 11 transient-state motion segments in FIG. 3 are fragmented into a plurality of corresponding transient-state sub-motion segments, and the durations and the maximum speeds of the transient-state sub-motion segments formed through fragmentation are counted, as shown in Table 1.

TABLE 1

Fragmentation of transient-state motion segment

| Transient-state motion segment | Maximum speed (km/h) | Duration (s) | Transient-state sub-motion segment | Quantity of transient-state sub-motion segments |
|---|---|---|---|---|
| Transient-state motion segment 1 | 7.8 | 12 | Segment 1 | 1 |
| Transient-state motion segment 2 | 17.5 | 12 | Segment 2 | 2 |
|  | 10.3 | 12 | Segment 3 |  |
| Transient-state motion segment 3 | 29.2 | 21 | Segment 4 | 2 |
|  | 25.7 | 16 | Segment 5 |  |
| Transient-state motion segment 4 | 33.3 | 31 | Segment 6 | 2 |
|  | 30.3 | 21 | Segment 7 |  |
| Transient-state motion segment 5 | 16.4 | 16 | Segment 8 | 4 |
|  | 22.5 | 17 | Segment 9 |  |
|  | 26.7 | 17 | Segment 10 |  |
|  | 36.6 | 21 | Segment 11 |  |
| Transient-state motion segment 6 | 53.3 | 45 | Segment 12 | 2 |
|  | 44.8 | 55 | Segment 13 |  |
| Transient-state motion segment 7 | 32.9 | 36 | Segment 14 | 7 |
|  | 25.5 | 10 | Segment 15 |  |
|  | 37 | 21 | Segment 16 |  |
|  | 41 | 16 | Segment 17 |  |
|  | 43.1 | 35 | Segment 18 |  |

TABLE 1-continued

Fragmentation of transient-state motion segment

| Transient-state motion segment | Maximum speed (km/h) | Duration (s) | Transient-state sub-motion segment | Quantity of transient-state sub-motion segments |
|---|---|---|---|---|
|  | 41.6 | 29 | Segment 19 |  |
|  | 35.3 | 24 | Segment 20 |  |
| Transient-state motion segment 8 | 60.5 | 77 | Segment 21 | 1 |
| Transient-state motion segment 9 | 21.1 | 27 | Segment 22 | 4 |
|  | 43.5 | 50 | Segment 23 |  |
|  | 42 | 17 | Segment 24 |  |
|  | 61.1 | 46 | Segment 25 |  |
| Transient-state motion segment 10 | 43 | 53 | Segment 26 | 9 |
|  | 45.4 | 31 | Segment 27 |  |
|  | 45.9 | 16 | Segment 28 |  |
|  | 47.4 | 18 | Segment 29 |  |
|  | 40.7 | 12 | Segment 30 |  |
|  | 48.9 | 58 | Segment 31 |  |
|  | 56.8 | 45 | Segment 32 |  |
|  | 58.2 | 38 | Segment 33 |  |
|  | 71 | 59 | Segment 34 |  |
| Transient-state motion segment 11 | 50.7 | 58 | Segment 35 | 6 |
|  | 51.9 | 34 | Segment 36 |  |
|  | 61 | 41 | Segment 37 |  |
|  | 67.4 | 53 | Segment 38 |  |
|  | 67.5 | 47 | Segment 39 |  |
|  | 85.1 | 122 | Segment 40 |  |

As shown in Table 1, the transient-state motion segment 1 and the transient-state motion segment 8 belong to single motion segments, and the remaining transient-state motion segments are multi-motion segments (including two or more transient-state sub-motion segments). For the multi-motion segments, considering that the maximum speeds of part of the transient-state sub-motion segments are close and the durations are shorter, the multi-motion segments are merged.

The following will describe merging by taking the transient-state motion segment 7 and the transient-state motion segment 10 as examples, and a merging rule is as follows: the maximum speed difference between the adjacent transient-state sub-motion segments is smaller than 5 km/h, and the duration of the transient-state sub-motion segment is smaller than 45 s.

If the transient-state motion segment 7 is fragmented into 7 transient-state sub-motion segments, the transient-state sub-motion segments are numbered as 14-20. Wherein the duration of the transient-state sub-motion segment 14 is 36 s, and is smaller than 45 s, and the transient-state sub-motion segment 14 needs to be merged with the transient-state sub-motion segment 15. The duration of the transient-state sub-motion segment 14 after being merged with the transient-state sub-motion segment 15 is 46 s, and is greater than 45 s, but the maximum speed difference between the merged transient-state sub-motion segment (14,15) and the transient-state sub-motion segment 16 is 4.1 km/h, so the merged transient-state motion segment (14,15) still needs to be merged with the transient-state sub-motion segment 16; the duration of the merged transient-state motion segment (14,15) after being merged with the transient-state sub-motion segment 16 is 67 s, and is greater than 45 s, but the maximum speed difference between the merged transient-state motion segment(14, 15, 16) and the transient-state sub-motion segment 17 is 4.0 km/h, so the merged transient-state motion segment(14, 15, 16) needs to be merged with the transient-state sub-motion segment 17; the duration of the merged transient-state motion segment (14, 15, 16) after being merged with the transient-state sub-motion segment 17 is 83 s, and is greater than 45 s, but the maximum speed difference between the merged transient-state motion segment (14, 15, 16, 17) and the transient-state sub-motion segment 18 is 2.1 km/h, so the merged transient-state motion segment (14, 15, 16, 17) still needs to be merged with the transient-state sub-motion segment 18; the duration of the merged transient-state sub-motion segment (14, 15, 16, 17) after being merged with the transient-state sub-motion segment 18 is 118 s, and is greater than 45 s, but the maximum speed difference between the merged transient-state sub-motion segment(14, 15, 16, 17, 18) and the transient-state sub-motion segment 19 is 1.5 km/h, so the merged transient-state sub-motion segment (14, 15, 16, 17, 18) still needs to be merged with the transient-state sub-motion segment 19; and the duration of the transient-state sub-motion segment (14, 15, 16, 17, 18). after being merged with the transient-state sub-motion segment 19 is 147 s, and is greater than 45 s, and the maximum speed difference between the transient-state sub-motion segment(14, 15, 16, 17, 18, 19) and the transient-state sub-motion segment 20 is 7.8 km/h, and is greater than 5 km/h, but the duration of the transient-state sub-motion segment 20 is only 24 s, and is smaller than 45 s, still needs to be merged with the merged transient-state sub-motion segment (14, 15, 16, 17, 18, 19). Finally, the transient-state sub-motion segments 14-20 are all merged.

If the transient-state motion segment 10 is fragmented into 9 transient-state sub-motion segments, the transient-state sub-motion segments are numbered as 26-34. Wherein the duration of the transient-state sub-motion segment 26 is 53 s, and is greater than 45 s, but the maximum speed difference between the transient-state sub-motion segment 26 and the transient-state sub-motion segment 27 is 2.4 km/h, and is smaller than 5 km/h, so the transient-state sub-motion segment 26 needs to be merged with the transient-state sub-motion segment 27; the duration of the merged transient-state sub-motion segment 26 after being merged with the transient-state sub-motion segment 27 is 84 s, and is greater than 45 s, but the maximum speed difference between the merged transient-state sub-motion segment(26, 27) and the transient-state sub-motion segment 28 is 0.5 km/h, so the merged transient-state sub-motion segment(26, 27) still needs to be merged with the transient-state sub-motion segment 28; the duration of the merged transient-state sub-motion segment(26,27) after being merged with the transient-state sub-motion segment 28 is 100 s, and is greater than 45 s, but the maximum speed difference between the merged transient-state sub-motion segment(26, 27, 28) and the transient-state sub-motion segment 29 is 1.5 km/h, so the merged transient-state sub-motion segment(26, 27, 28) still needs to be merged with the transient-state sub-motion segment 29; the duration of the merged transient-state sub-motion segment(26, 27, 28) after being merged with the transient-state sub-motion segment 29 is 118 s, and is greater than 45 s, but the maximum speed difference between the merged transient-state sub-motion segment(26, 27, 28, 29) and the transient-state sub-motion segment 30 is 6.7 km/h, and is greater than 5 km/h, so merging ends, resulting in the formation of a new merged transient-state sub-motion segment A(26, 27, 28, 29), wherein the duration of the transient-state sub-motion segment A is 118 s, and the maximum speed is 47.4 km/h; the duration of the transient-state sub-motion segment 30 is 12 s, and is smaller than 45 s, so the transient-state sub-motion segment 30 needs to be merged with the transient-state sub-motion segment 31; the duration of the merged transient-state sub-motion segment 30 after being merged with the transient-state sub-motion segment 31 is 70 s, and is greater than 45 s, and the maximum speed difference between the merged transient-state sub-motion segment (30,31) and the transient-state sub-motion segment 32 is 7.9 km/h, and is greater than 5 km/h, so merging ends, resulting in the formation of a new transient-state sub-motion segment B(30,31), wherein the duration of the merged transient-state sub-motion segment B is 70 s, and the maximum speed is 48.9 km/h; the duration of the transient-state sub-motion segment 32 is 42 s, and is smaller than 45 s, so the transient-state sub-motion segment 32 needs to be merged with the transient-state sub-motion segment 33; the duration of the transient-state sub-motion segment 32 after being merged with the transient-state sub-motion segment 33 is 80 s, and is greater than 45 s, but the maximum speed difference between the merged transient-state sub-motion segment (32,33) and the transient-state sub-motion segment 34 is 12.8 km/h, and is greater than 5 km/h, so merging ends, resulting in the formation of a new merged transient-state sub-motion segment C(32,33), wherein the duration of the transient-state sub-motion segment C is 80 s, and the maximum speed is 58.2 km/h; the duration of the transient-state sub-motion segment 34 is 59 s, and is greater than 45 s, so merging is not required, and a transient-state sub-motion segment D is formed; the duration of the merged transient-state sub-motion segment A and the duration of the transient-state sub-motion segment B are both greater than 45 s, but the maximum speed difference between the A and B is 1.5 km/h, merging is continued to form a merged transient-state sub-motion segment E(26, 27, 28, 39, 30, 31), wherein the duration of the merged transient-state sub-motion segment E is 188 s, and the maximum speed is 48.9 km/h; and finally, the transient-state motion segment 10 is merged into 3 transient-state sub-motion segments, as shown in Table 2.

TABLE 2

Merging of transient-state sub-motion segments of transient-state motion segment 10

| Number of motion segment | Maximum speed (km/h) | Duration (s) |
|---|---|---|
| transient-state sub-motion segment E | 48.9 | 188 |
| transient-state sub-motion segment C | 58.2 | 80 |
| transient-state sub-motion segment D | 71.0 | 59 |

Finally, the transient-state sub-motion segments of the 11 transient-state motion segments are merged through the above method, wherein 11 motion segments formed after merging are shown in Table 3. The motion segment 6 and the motion segment 9 are of a double-segment structure, each contains 2 sub-motion segments; the motion segment 10 and the motion 11 are of a three-segment structure, each contains 3 sub-motion segments; and the rest are of a single-segment structure, each contains 1 sub-motion segment.

TABLE 3

Merged motion segments

| Number of motion segment | Maximum speed (km/h) | Duration (s) | Quantity of sub-motion segments |
|---|---|---|---|
| Motion segment 1 | 7.8 | 12 | 1 |
| Motion segment 2 | 17.5 | 24 | 1 |
| Motion segment 3 | 29.2 | 37 | 1 |
| Motion segment 4 | 33.3 | 52 | 1 |
| Motion segment 5 | 36.6 | 71 | 1 |
| Motion segment 6 | 53.3 | 45 | 2 |
|  | 44.8 | 55 |  |
| Motion segment 7 | 43.1 | 171 | 1 |
| Motion segment 8 | 60.5 | 77 | 1 |
| Motion segment 9 | 43.5 | 94 | 2 |
|  | 61.1 | 46 |  |
| Motion segment 10 | 48.9 | 188 | 3 |
|  | 58.2 | 83 |  |
|  | 71 | 59 |  |
| Motion segment 11 | 61 | 133 | 3 |
|  | 67.5 | 100 |  |
|  | 85.1 | 122 |  |

The maximum constant speed under the steady-state driving condition is determined according to the maximum speed of each motion segment, where the maximum speed is located on the constant speed segment, and an empirical formula is as follows:

$$V_{constant\ speed} = V_{max} \times 0.8.$$

Considering test operability, the results need to be rounded finally.

The calculated speed of the constant speed segment of each single-segment structure motion segment is shown in Table 4.

TABLE 4

Constant speed of single-segment structure

| Serial number of segments | Maximum speed (km/h) | Constant speed (km/h) |
|---|---|---|
| 1 | 7.8 | 6 |
| 2 | 17.5 | 14 |
| 3 | 29.2 | 23 |
| 4 | 33.3 | 27 |
| 5 | 36.6 | 29 |
| 7 | 43.1 | 34 |
| 8 | 60.5 | 48 |

The calculated speed of the constant speed segment of each double-segment structure motion segment is shown in Table 5.

TABLE 5

Constant speed of double-segment structure motion segment

| Serial number of segments | Segment 1 Peak speed (km/h) | Constant speed (km/h) | Segment 2 Peak speed (km/h) | Constant speed (km/h) |
|---|---|---|---|---|
| 6 | 53.3 | 43 | 44.8 | 36 |
| 9 | 43.5 | 35 | 61.1 | 49 |

The calculated speed of the constant speed segment of each motion segment with the three-segment motion structure is shown in Table 6.

TABLE 6

Constant speed of three-segment structure motion segment

| Serial number of segments | Segment 1 | | Segment 2 | | Segment 3 | |
|---|---|---|---|---|---|---|
| | Peak speed (km/h) | Constant speed (km/h) | Peak speed (km/h) | Constant speed (km/h) | Peak speed (km/h) | Constant speed (km/h) |
| 10 | 48.9 | 39 | 58.2 | 47 | 71.0 | 57 |
| 11 | 61.0 | 49 | 67.5 | 54 | 85.1 | 68 |

The acceleration meanacc$_{acceleration}$ and deceleration meanacc$_{deceleration}$ of each steady-state motion segment under the steady-state driving condition are determined based on the mean acceleration and mean deceleration of each motion segment, as shown in Table 7:

TABLE 7

Acceleration of each motion segment under steady-state driving condition

| Serial number of segments | steady-state acceleration (m/s$^2$) | steady-state deceleration (m/s$^2$) |
|---|---|---|
| 1 | 0.5382 | −0.3542 |
| 2 | 0.5038 | −0.5076 |
| 3 | 0.5037 | −0.5301 |
| 4 | 0.5300 | −0.5233 |
| 5 | 0.5760 | −0.5918 |
| 6 | 0.5669 | −0.5600 |
| 7 | 0.5186 | −0.5330 |
| 8 | 0.5078 | −0.4980 |
| 9 | 0.4996 | −0.6317 |
| 10 | 0.4968 | −0.5607 |
| 11 | 0.3727 | −0.4374 |

The corresponding duration of each steady-state motion segment under the steady-state driving condition is calculated according to formulae 2-7, as shown in Table 8

TABLE 8

Total duration of acceleration, deceleration and constant speed processes for each steady-state motion segment under steady-state driving condition

| Serial number of segments | Duration of acceleration (s) | Duration of deceleration (s) | Duration of constant speed (s) |
|---|---|---|---|
| 1 | 2 | 4 | 6 |
| 2 | 7 | 7 | 10 |
| 3 | 11 | 11 | 15 |
| 4 | 13 | 13 | 26 |
| 5 | 13 | 13 | 45 |
| 6 | 20 | 20 | 60 |
| 7 | 17 | 17 | 137 |
| 8 | 25 | 26 | 26 |
| 9 | 26 | 21 | 93 |
| 10 | 31 | 27 | 272 |
| 11 | 50 | 42 | 263 |

Figure 8:
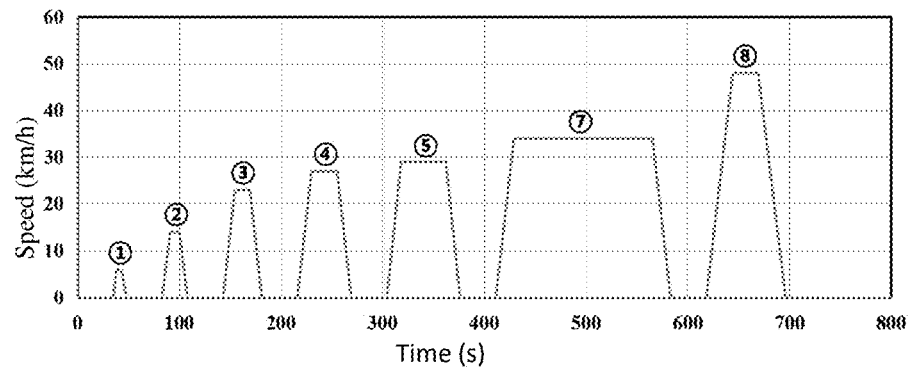
FIG. 8 is a driving condition curve of a developed single-segment steady-state motion segment.

For the motion segment with the single-segment structure, the steady-state motion segment is in the form of uniform acceleration+constant speed+uniform deceleration, and the steady-state motion segments consisting of the motion segments 1, 2, 3, 4, 5, 7 and 8 are shown in FIG. 8.

For the motion segments with the double-segment motion and three-segment structures, the steady-state motion segments are in the form of uniform acceleration+constant speed+uniform acceleration/deceleration+constant speed+uniform deceleration and uniform acceleration+constant speed+uniform acceleration/deceleration+constant speed+uniform acceleration/deceleration+constant speed+uniform deceleration. The constant speed durations of sections of the motion sections with the double-section and three-section structures are calculated through formulae 2-8. The calculation result of each segment is shown in Tables 3 to 9.

TABLE 9

Duration of constant speed process of steady-state motion segments with double-segment and three-segment structures

| Serial number of segments | Segment 1 | | Segment 2 | | Segment 3 | |
|---|---|---|---|---|---|---|
| | Proportion (%) | Duration of constant speed (s) | Proportion | Duration of constant speed (s) | Proportion (%) | Duration of constant speed (s) |
| 6 | 45.00 | 27 | 55.00 | 33 | | |
| 9 | 67.14 | 62 | 32.86 | 31 | | |
| 10 | 56.97 | 155 | 25.15 | 68 | 17.88 | 49 |
| 11 | 37.46 | 99 | 28.17 | 74 | 34.37 | 90 |

Figure 9:
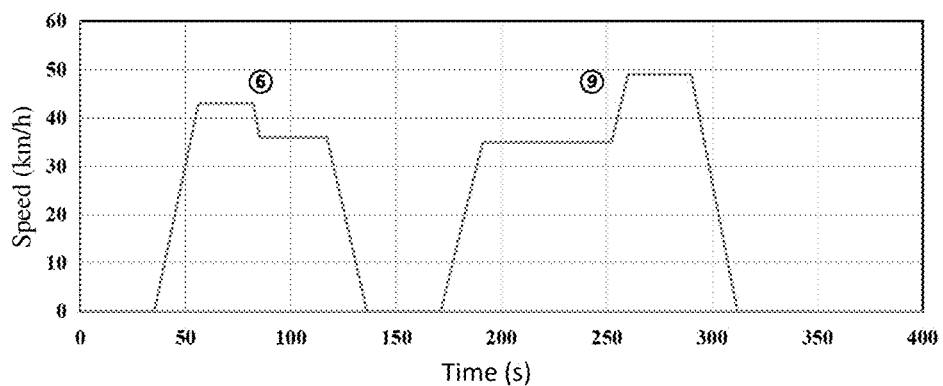
FIG. 9 is a driving condition curve of a developed double-segment steady-state motion segment.
Figure 10:
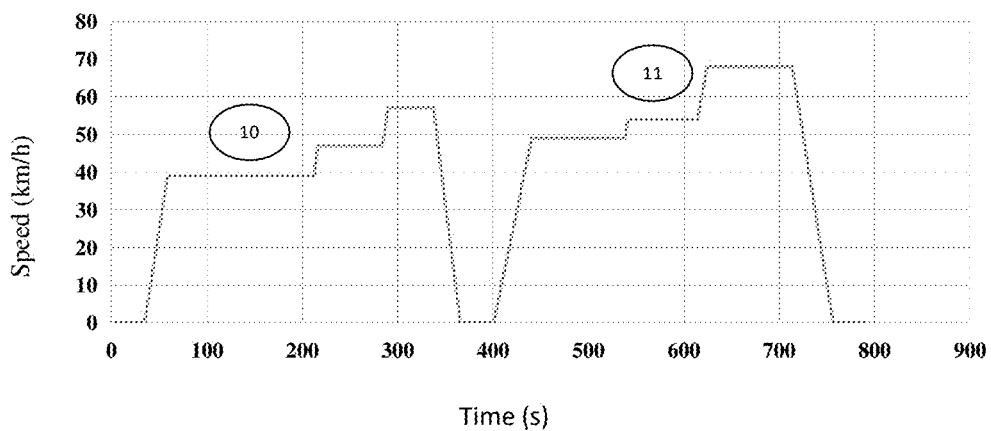
FIG. 10 is a driving condition curve of a developed ternary-segment steady-state motion segment.

The steady-state motion segments consisting of the motion segments 6 and 9 with the double-segment structures are shown in FIG. 9, and the steady-state motion segments consisting of the motion segments 10 and 11 with the three-segment structures are shown in FIG. 10.

Figure 11:
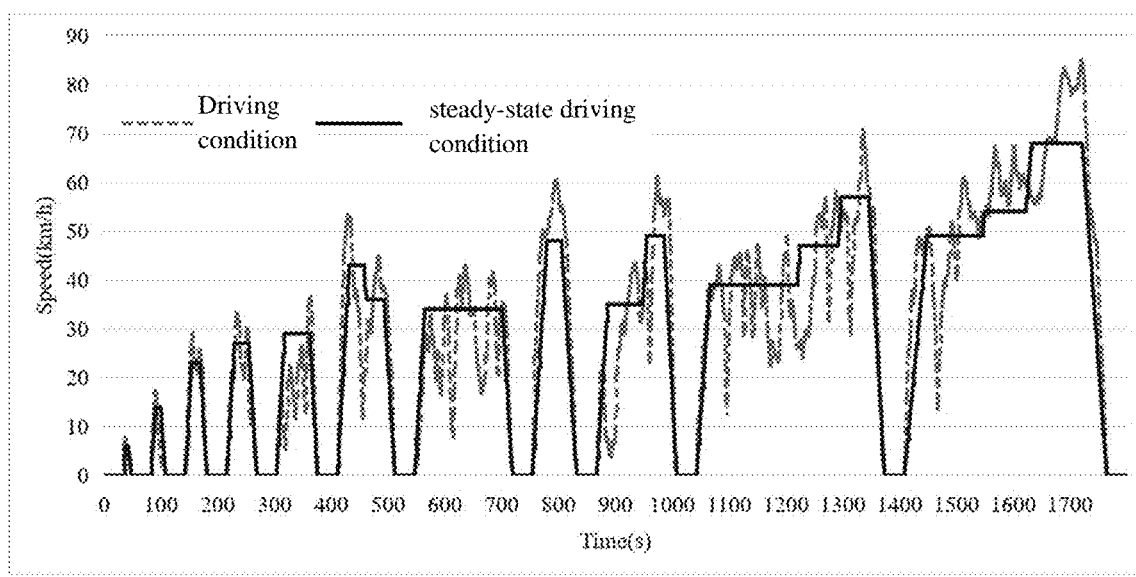
FIG. 11 is a developed steady-state site test driving condition curve.

The steady-state motion segments are connected sequentially according to the time axis of the driving condition, idle segments for 36 s are inserted between the transient-state motion segments and at the beginning position of the driving condition, idle segments for 35 s are inserted at the end position of the driving condition, and finally the steady-state driving condition is developed, as shown in FIG. 11.

Deviations between characteristic parameters of the steady-state driving condition and characteristic parameters of the transient-state driving condition are shown in Table 10, and the deviations between the characteristic parameters of the steady-state driving condition developed through the method and the characteristic parameters of the transient-state driving condition do not exceed 3%, which meets the precision requirement of developing the driving condition.

TABLE 10

Deviation among driving conditions

| | mean speed (km/h) | Mean driving speed (km/h) | Mean acceleration (m/s$^2$) | Mean deceleration (m/s$^2$) | Idle proportion |
|---|---|---|---|---|---|
| transient-state driving condition | 28.35 | 37.27 | 0.48 | −0.53 | 23.94% |
| steady-state driving condition | 28.33 | 37.25 | 0.47 | −0.52 | 23.94% |
| Deviation (%) | −0.07 | −0.05 | −2.08 | −1.89 | 0.00 |

The vehicle is tested under the developed steady-state driving condition:

Before the vehicle range test, the vehicle needs to be pretreated. Firstly, the vehicle tires are replaced with the snow tires or the high-temperature-resistant tires, and tire pressure is adjusted according to a method in GB18352.6-2016 Annex C; and after the adjustment is finished, high-speed discharge is carried out at the normal temperature (such as 23° C.+/−3° C.) and the constant speed of 120 km/h in the laboratory environment cabin and stops until the remaining battery power displayed on the vehicle's dashboard is 0. Secondly, the vehicle is charged in the environmental cabin until the charging pile or the vehicle's dashboard indicates that the charging is completed, wherein the temperature of the environmental cabin is set to be the average temperature (10° C.) of the local garage during charging; and then, the fully charged vehicle is placed in a vehicle dipping room for vehicle dipping, wherein the vehicle dipping temperature is 10° C., and the vehicle soaking time is 8 hours.

At the end of vehicle pretreatment, the driving range test is performed on the test site. Before the test begins, the V-BOX smart vehicle-mounted terminal is installed on the vehicle, which is configured to collect the driving speed of the vehicle; the setting of the air conditioner of the vehicle is consistent with the range test method at high and low temperatures in GB/T18386.1-2021 during the driving process; and if the estimated test duration exceeds 6 hours, the driver operates the vehicle by turns every 6 hours until the vehicle's dashboard displays the remaining battery power as 0, then the test is ended.

Wherein the range result S (unit: km) is calculated with following formula:

$$S = \sum_{i=1}^{end} v_i/3600$$

where $v_i$ is the speed of the vehicle at the $i^{th}$ second after the beginning of the test, unit (km/h).

Finally, the calculation yields the range test result of 342 km for the tested vehicle.

Basic principles and main characteristics of the present disclosure and advantages of the present disclosure are shown and described above. It is obvious that the present disclosure is not limited to the details of the above exemplary embodiments for those skilled in the art, and the present disclosure can be implemented in other specific forms without departing from the spirit or basic characteristics of the present disclosure.

Therefore, from any point of view, the embodiments should be considered to be exemplary and unrestricted. The scope of the present disclosure is defined by the accompanying claims rather than the above-mentioned description, and therefore all changes within the meaning and scope of the equivalents of the claims are included in the present disclosure.

In addition, it should be understood that, although the specification is described according to the implementations, not every implementation only contains one independent technical solution; such description of the specification is only for clearness; and those skilled in the art should regard the specification as a whole, and the technical solutions in each embodiment can also be properly combined to form other implementations which can be understood by those skilled in the art.

What is claimed:

1. A steady-state site driving condition development method to carry out vehicle driving range tests based on a transient-state driving condition, comprising:
    S1. fragmenting a chassis drum transient-state driving condition expressed as a laboratory chassis drum transient-state speed-time curve by a short-range method to obtain transient-state motion segments;
    S2. pretreating the fragmented transient-state motion segments to obtain a minimum speed of the pretreated transient-state motion segments, and fragmenting the transient-state motion segment that is not pretreated with reference to coordinates corresponding to the minimum speed to obtain a plurality of transient-state sub-motion segments;
    S3. merging the transient-state sub-motion segments meeting merging requirements according to maximum speeds and durations of the transient-state sub-motion segments, and recording maximum speeds and durations of merged transient-state motion segments formed by combining the non-merged transient-state sub-motion segments and the merged transient-state sub-motion segments;
    S4. calculating maximum constant speeds under a steady-state driving condition based on the maximum speeds of the transient-state sub-motion segments, and calculating mean accelerations and mean decelerations of steady-state motion segments;
    S5. converting acceleration and deceleration processes of the transient-state sub-motion segments into uniform acceleration and uniform deceleration processes according to the maximum constant speeds, calculating acceleration durations and deceleration durations of the steady-state motion segments, calculating constant speed durations according to a total duration of the steady-state motion segments, and finally obtaining the steady-state motion segment corresponding to each transient-state sub-motion segment; and S6. sequentially connecting a plurality of steady-state motion segments according to time axes, inserting idle segments with fixed durations between the steady-state motion segments and at the beginning and end of a steady-state driving condition, and finally developing a steady-state site test driving condition based on the chassis drum transient-state driving condition, and utilizing the steady-state site test driving condition to carry out the vehicle driving range tests on a test site, thus providing a unified test driving condition for enterprises to carry out vehicle range tests on the test site with the laboratory chassis drum transient-state driving condition through the development of the steady-state site test driving condition;

wherein before testing the vehicle after obtaining the steady-state site test driving condition, the vehicle to be tested is required to be pretreated to reach a state required by the test, followed by carrying out the test; firstly vehicle tires are replaced with snow tires or high-temperature-resistant tires, and tire pressure is adjusted; and after adjustment is finished, a discharge is carried out at a temperature of 23° C.+/−3° C. and a constant speed of 120 km/h in a laboratory environment cabin and then stops until a remaining battery power displayed on a vehicle's dashboard is 0; secondly, the vehicle is charged in the environmental cabin until a charging pile or the vehicle's dashboard indicates that the charging is completed, wherein the temperature of the environmental cabin is set to be the average temperature of a local garage during charging at 10° C.; and then, the fully charged vehicle is placed in a vehicle dipping room for vehicle dipping, wherein the vehicle dipping temperature is consistent with the average temperature of the local garage at 10° C., and a vehicle dipping time is not less than 8 hours; and before the test begins, a V-BOX smart vehicle-mounted terminal is installed on the vehicle to be tested, which is configured to collect a driving speed of the vehicle; a setting of an air conditioner of the vehicle is consistent with the range test method during a driving process; and for an test duration exceeding 6 hours, the driver operates the vehicle by turns every 6 hours until the vehicle's dashboard displays the remaining battery power as 0, the test is ended.

2. The steady-state site driving condition development method according to claim 1, wherein in step S2, the pretreatment is to smooth the transient-state motion segment obtained by fragmentation with the short-range method by a moving average window method.

3. The steady-state site driving condition development method according to claim 1, wherein in step S2, one transient-state sub-motion segment refers to a transient-state motion segment between time axes corresponding to two adjacent minimum speed of the transient-state motion segment that is not pretreated.

4. The steady-state site driving condition development method according to claim 1, wherein in step S2, the step of fragmenting the transient-state motion segment that is not pretreated with reference to the coordinates corresponding to the minimum speed involves fragmenting the transient-state motion segment that is not pretreated based on time coordinates corresponding to the minimum speed.

5. The steady-state site driving condition development method according to claim 1, wherein in step S3, the step of merging the transient-state sub-motion segments meeting the merging requirements includes:

judging whether a maximum speed difference between the adjacent transient-state sub-motion segments is smaller than a speed threshold and whether the duration of the single transient-state sub-motion segment is smaller than a duration threshold; if yes, merging the adjacent transient-state sub-motion segments until a maximum speed difference between a combination of the merged transient-state motion segments and the next transient-state sub-motion segment is greater than or equal to a speed threshold and the duration of the combination of the merged transient-state motion segments is greater than or equal to a duration threshold.

6. The steady-state site driving condition development method based on a transient-state driving condition according to claim 1, wherein in step S3, the merged transient-state motion segment includes a single-segment motion segment only including the single sub-motion segment and a multi-segment motion segment including a combination of at least two transient-state sub-motion segments.

7. The steady-state site driving condition development method according to claim 1, wherein in step S4, the maximum constant speed under the steady-state driving condition is calculated with following formula:

$V_{constant\ speed} = V_{max} \times 0.8$, where $V_{max}$ is the maximum speed of the transient-state sub-motion segment, and $V_{constant\ speed}$ is the maximum constant speed under the steady-state driving condition; and the mean acceleration and the mean deceleration of each of the steady-state motion segments are calculated with following formula:

$$meanacc_{acceleration} = \frac{\sum a^+}{t_{a^+}}, meanacc_{deceleration} = \frac{\sum a^-}{t_{a^-}}, a_i = \frac{v_{i+1} - v_{i-1}}{7.2}$$

where $a_i$ is an acceleration of the merged transient-state motion segment at the $i^{th}$ second, $v_{i+1}$ and $v_{i-1}$ are speeds of the merged transient-state motion segment at the $i+1^{th}$, $i-1^{th}$ second (unit: km/h), and $meanacc_{acceleration}$ is the mean acceleration of the steady-state motion segment (unit: m/s$^2$); $a^+$ is an acceleration value of the merged transient-state motion segment during acceleration (unit: m/s$^2$); $t_{a^+}$ is cumulative time of the merged transient-state motion segment during acceleration (unit: s); $meanacc_{deceleration}$ is the mean deceleration of the steady-state motion segment (unit: m/s$^2$); $a^-$ is a deceleration value of the merged transient-state motion segment during deceleration (unit: m/s$^2$); and $t_{a^-}$ is cumulative time of the merged transient-state motion segment during deceleration (unit: s).

8. The steady-state site driving condition development method according to claim 1, wherein in step S6, the duration of the idle segment is calculated with following formula:

$L_{idle} = (L_{driving\ condition} - L)/(\text{number of steady-state motion segments} + 1);$ where $L_{idle}$ is the duration of the to-be-inserted idle segment, $L_{driving\ condition}$ is a total duration of the transient-state driving condition including idle, and L is the total duration of the steady-state motion segments.

9. The steady-state site driving condition development method according to claim 1, wherein the method further includes the following steps after step S6:

calculating and comparing a deviation between preset indexes for the drum transient-state condition and the steady-state site test condition, and determining whether the developed steady-state site test condition accords with the driving characteristics of the drum transient-state driving condition based on the deviation;

the preset index includes a mean acceleration, a mean deceleration, a mean speed, a mean driving speed and an idle proportion; and the mean speed is a mean of all speed points, the mean driving speed is a mean of all speed points excluding where the speed is 0, and the idle proportion is the proportion of the moment at which the speed is 0 to the total duration of the driving condition.

* * * * *